US012733308B2

(12) United States Patent
Wipiejewski et al.

(10) Patent No.: US 12,733,308 B2
(45) Date of Patent: Sep. 8, 2026

(54) PIXEL STRUCTURE FOR ELECTRONIC DISPLAY, AND ELECTRONIC DEVICE COMPRISING SUCH DISPLAY

(71) Applicant: Huawei Technologies Co., Ltd., Shenzhen (CN)

(72) Inventors: Torsten Wipiejewski, Munich (DE); Zhao Zhao, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 738 days.

(21) Appl. No.: 18/002,296

(22) PCT Filed: Jun. 19, 2020

(86) PCT No.: PCT/EP2020/067228
§ 371 (c)(1),
(2) Date: Dec. 19, 2022

(87) PCT Pub. No.: WO2021/254642
PCT Pub. Date: Dec. 23, 2021

(65) Prior Publication Data

US 2023/0261151 A1 Aug. 17, 2023

(51) Int. Cl.
*H10H 20/851* (2025.01)
*H10H 20/855* (2025.01)
*H10W 90/00* (2026.01)

(52) U.S. Cl.
CPC ...... *H10H 20/8513* (2025.01); *H10H 20/855* (2025.01); *H10W 90/00* (2026.01)

(58) Field of Classification Search
CPC ............. H10H 20/8513; H10H 20/855; H10H 29/8513; H10H 29/8514; H10H 29/8515;
(Continued)

(56) References Cited

U.S. PATENT DOCUMENTS

2006/0291246 A1* 12/2006 Hattori ............... H10H 20/8515 257/E33.072
2011/0182056 A1* 7/2011 Trottier .............. H10H 20/8515 362/293

(Continued)

FOREIGN PATENT DOCUMENTS

CN 1885581 A 12/2006
CN 108428716 A 8/2018

(Continued)

*Primary Examiner* — Marlon T Fletcher
*Assistant Examiner* — Samuel Jonathan Smith
(74) *Attorney, Agent, or Firm* — Slater Matsil, LLP

(57) ABSTRACT

A pixel structure for an electronic display, the pixel structure comprising a substrate, at least one LED emitter arranged on the substrate, and at least one wavelength conversion unit arranged on the substrate adjacent to the LED emitter. The LED emitter is configured to emit emission radiation, the emission radiation being within an emission wavelength range and emitted in one or multiple emission directions within a main emission plane. The wavelength conversion unit is configured to convert the emission radiation to converted radiation within a converted wavelength range, the converted wavelength range being different from the emission wavelength range. The converted radiation propagates from the wavelength conversion unit in a main conversion direction perpendicular to the main emission plane, the main conversion direction being, for example, a direction towards a user of an electronic device having an electronic display comprising at least one such pixel structure.

20 Claims, 7 Drawing Sheets

(58) Field of Classification Search

CPC ........... H10H 20/8515; H10H 20/8514; H10H 20/851; H10H 29/142; H01L 25/0753; H10W 90/00

See application file for complete search history.

(56) References Cited

U.S. PATENT DOCUMENTS

| | | | | |
|---|---|---|---|---|
| 2014/0339495 | A1 | 11/2014 | Bibl et al. | |
| 2015/0085527 | A1* | 3/2015 | Nam | H10H 20/856 438/27 |
| 2015/0331285 | A1 | 11/2015 | Bibl et al. | |
| 2016/0284950 | A1* | 9/2016 | Tseng | H10H 20/8513 |
| 2021/0373222 | A1* | 12/2021 | Van Bommel | G02B 6/0003 |

FOREIGN PATENT DOCUMENTS

| | | | |
|---|---|---|---|
| JP | 2009182241 | A | 8/2009 |
| JP | 2020080361 | A | 5/2020 |
| JP | 2020085938 | A | 6/2020 |
| JP | 2020085939 | A | 6/2020 |
| JP | 2020085944 | A | 6/2020 |
| WO | 2012059931 | A1 | 5/2012 |
| WO | 2019057647 | A1 | 3/2019 |

* cited by examiner

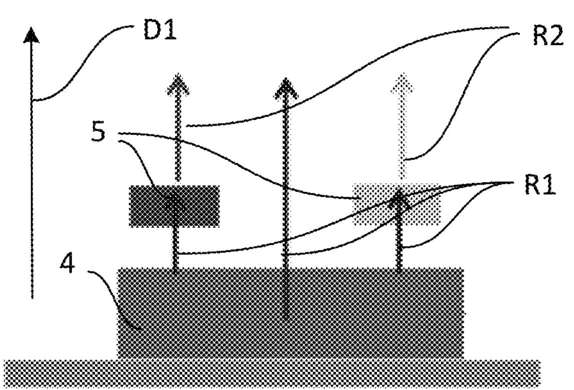
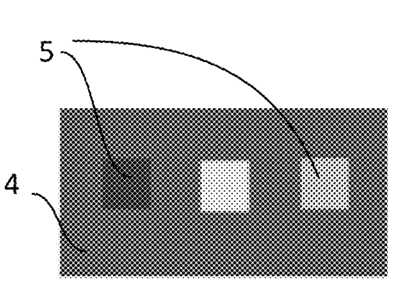
Fig. 1a (prior art) Fig. 1b
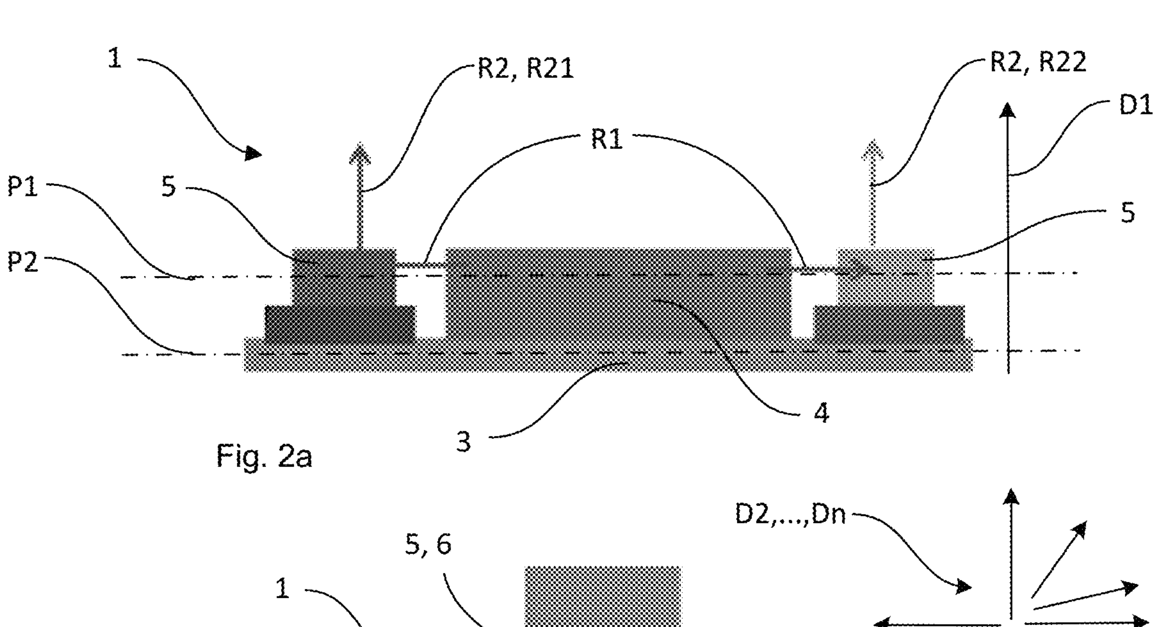
Fig. 2a
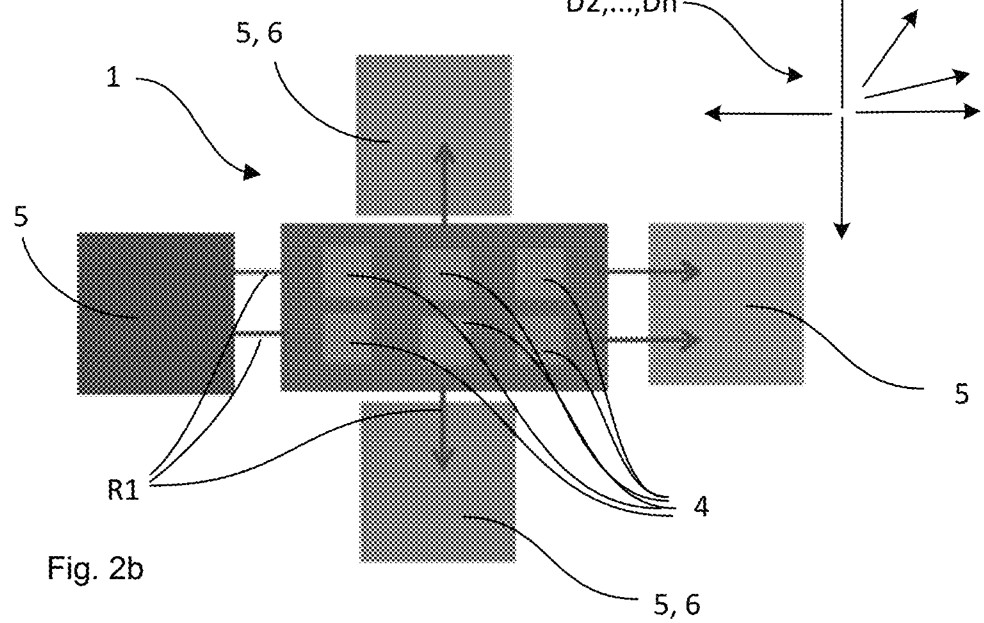
Fig. 2b

PIXEL STRUCTURE FOR ELECTRONIC DISPLAY, AND ELECTRONIC DEVICE COMPRISING SUCH DISPLAY

CROSS-REFERENCE TO RELATED APPLICATIONS

This application is a National Stage of International Application No. PCT/EP2020/067228, filed on Jun. 19, 2020, which is hereby incorporated by reference in its entirety.

TECHNICAL FIELD

The disclosure relates to a pixel structure for an electronic display, the pixel structure comprising at least one LED emitter and at least one wavelength conversion unit arranged on a substrate. The disclosure further relates to an electronic device comprising an electronic display having a user interface surface and at least one such pixel structure.

BACKGROUND

Micro light emitting diodes, known as Micro-LED, mLED, or uLED, are used in displays for mobiles devices such as smart phones, TVs, PC's, tablets, smart glasses, wearables, and many other consumer and industry devices. A micro-LED is usually composed of a large number array of small LED emitters, and a promising future display technology with many potential advantages such as high brightness and contrast, high power efficiency, wide color gamut and flexibility of form factors and various function integrations.

Micro-LED display technology mainly utilizes on of two schemes, a direct emission scheme or a color conversion scheme.

In the direct emission scheme, each individual LED emitter emits radiation in the red, green, or blue spectral range. Such direct emission solutions are very expensive to manufacture, since each pixel structure requires one red spectral range emitter, one green spectral range emitter, and one blue spectral range emitter, such that a display with a resolution of about 8 million pixels would require about 24 million LED emitters.

In the color conversion scheme, only LED emitters emitting radiation in, e.g., the blue spectral range are used. The LED emitter chips are typically based on the GaN (gallium nitride) material system. Blue-to-red and blue-to-green radiation conversion units are stacked on top of corresponding LED pixels, and used to convert the blue spectral range radiation from some LED emitters to red spectral range radiation or green spectral range radiation, respectively. Compared to the direct emission scheme, the color conversion scheme is easier and cheaper to manufacture, since only one type of LED emitter is required.

The blue spectral range radiation is partially absorbed by the conversion unit, the absorption following an exponential decrease to first order. Ideally, almost all of the blue spectral range radiation should be absorbed by the conversion unit in order to keep the energy efficiency high and to minimize blue spectral range radiation leakage from the conversion units.

Furthermore, the conversion unit should have area dimensions similar to those of LED emitter. The height of the conversion unit is preferably larger, in order to form small pillars on top of the small size LED emitters. This facilitates a larger distance for the blue spectral range radiation to propagate through the conversion unit, and hence, facilitates absorption.

However, in practice, the conversion material should be one or a few hundred μm thick in order to absorb most of the blue spectral range radiation. This gives a very large aspect ratio of 100 μm:3 μm or more, between LED emitter and conversion unit, which is not easy to achieve using micro structuring methods. A further challenge is that the green spectral range radiation or red spectral range radiation also has to propagate through the conversion unit and might also be slightly absorbed by the material of the conversion unit (self absorption). This reduces the efficiency of the device.

Additionally, such stacked structures have poor heat dissipation, because the heat from the conversion unit has to penetrate through the underlying LED emitter chip. This heats up the LED emitter chip further and reduces the lifetime of the pixel structure. The stacking also makes it difficult to integrate other functional optical elements such as lenses.

SUMMARY

It is an object to provide an improved micro-LED pixel structure. The foregoing and other objects are achieved by the features of the independent claim(s). Further implementation forms are apparent from the dependent claims, the description, and the figures.

According to a first aspect, there is provided a pixel structure for an electronic display, the pixel structure comprising a substrate, at least one LED emitter arranged on the substrate, the LED emitter being configured to emit emission radiation, the emission radiation being within an emission wavelength range and emitted in one or multiple emission directions within a main emission plane, at least one wavelength conversion unit arranged on the substrate adjacent the LED emitter, the wavelength conversion unit being configured to convert the emission radiation to converted radiation, the converted radiation being within a converted wavelength range and propagating, from the wavelength conversion unit, in a main conversion direction perpendicular to the main emission plane, the converted wavelength range being different from the emission wavelength range.

This arrangement enables a pixel structure which has a significantly reduced height, due to the conversion units being arranged adjacent the LED emitters as opposed to being stacked on top of the LED emitters. This type of distribution improves the heat dissipation of the structure, which, in turn, improves the lifetime of the pixel structure. Furthermore, since the conversion radiation extends substantially perpendicular to the emission radiation, there is a significantly reduced risk of emission radiation, e.g. within the blue spectrum range, leaking in the direction of the conversion radiation and hence affecting the converted radiation in e.g. the red spectrum range or the green spectrum range. Also, higher efficiency is achieved due to the direct propagation of converted radiation from the conversion unit, without interaction and re-absorption of the converted radiation by other conversion units.

In a possible implementation form of the first aspect the main emission plane is parallel with a main substrate plane of the substrate, the LED emitter(s) and the wavelength conversion unit(s) being distributed in the main emission plane.

In a further possible implementation form of the first aspect, the emission wavelength range is one of a blue spectral range or an ultraviolet spectral range, and when the pixel structure comprises at least two LED emitters, the LED emitters are configured to emit radiation having the same wavelength. By utilizing only one type of LED emitters, manufacturing of the pixel structure is far simpler and cheaper, due to there being only one main component instead of e.g. three different, and equally important, main components.

In a further possible implementation form of the first aspect, the pixel structure comprises at least two wavelength conversion units, each wavelength conversion unit being configured to convert the emission radiation within the emission wavelength range to the converted radiation within one of a plurality of different converted wavelength ranges, facilitating conversion of one and the same wavelength the emission radiation into converted radiation within any several different wavelength ranges.

In a further possible implementation form of the first aspect, at least one first wavelength conversion unit is configured to convert the emission radiation to a first converted radiation being within a first converted wavelength range, and at least one second wavelength conversion unit is configured to convert the emission radiation to a second converted radiation being within a second converted wavelength range, the second converted wavelength range being at least partially different from the first converted wavelength range. This allows one pixel structure radiation emitting radiation within several different wavelength ranges simultaneously and in the same direction, In a further possible implementation form of the first aspect, the first converted wavelength range is within a red spectral range and the second converted wavelength range is within a green spectral range, facilitating production of the commonly used RGB pixel structure.

In a further possible implementation form of the first aspect, the LED emitter is configured to emit emission radiation in the main emission plane only, or the emission radiation or at least one portion of the emission radiation, which is emitted in the main emission plane by the LED emitter, is converted to converted radiation in the wavelength conversion unit. This allows the pixel structure to have an as low height as possible, the height as seen in the main conversion direction, which in turn increases the freedom to place the LED emitter at any suitable location within the electronic device while also freeing up space for other components.

In a further possible implementation form of the first aspect, when the pixel structure comprises at least two LED emitters, at least one of the LED emitters is configured to emit emission radiation in the main conversion direction, allowing for example emission radiation within the blue spectral range to be emitted directly towards a user interface without conversion or redirecting taking place.

In a further possible implementation form of the first aspect, the pixel structure further comprises at least one radiation scattering unit arranged on the substrate adjacent to the LED emitter, the scattering unit being configured to redirect emission radiation, propagating in the main emission plane, to the main conversion direction, allowing a part of the emission radiation to be redirected, providing more freedom as regards the placement of the LED emitter within the electronic device.

In a further possible implementation form of the first aspect, the wavelength conversion unit comprises a wavelength conversion material, the wavelength conversion material preferably comprising a matrix material and wavelength conversion particles distributed within the matrix material.

In a further possible implementation form of the first aspect, the wavelength conversion particles are quantum dots or phosphorus material.

In a further possible implementation form of the first aspect, the wavelength conversion unit comprises at least one barrier extending along a periphery of the wavelength conversion unit in the main conversion direction, the barrier being configured to extend an absorption path of the wavelength conversion unit, the absorption path extending in the main emission plane, the emission radiation propagating along the absorption path, and the conversion of emission radiation to converted radiation occurring simultaneously with the propagation. The barrier allows individual pixel structures to be distributed with smaller pitch, since the barrier helps to reduce, or even avoid, optical cross-talk between adjacent pixel structures even if they are close. Furthermore, the barrier can function as a support surface for reflectors used to redirect radiation.

In a further possible implementation form of the first aspect, the pixel structure further comprises at least one wall reflector arranged on a surface of the barrier extending at least partially in the main conversion direction, the wall reflector being configured to redirect the emission radiation propagating along the absorption path, such that the absorption path of the wavelength conversion unit is extended within the main emission plane, allowing as much emission radiation as possible to be absorbed, and hence converted, by the wavelength conversion unit.

In a further possible implementation form of the first aspect, the pixel structure comprises at least one bottom reflector arranged between the wavelength conversion unit and the substrate, the bottom reflector extending at least partially in parallel with the main emission plane and being configured to redirect converted radiation propagating within the wavelength conversion unit to the main conversion direction, facilitating improvement of the output radiation efficiency.

In a further possible implementation form of the first aspect, at least one of the wall reflector and the bottom reflector extends at an angle to the main conversion direction, allowing the emission radiation and/or the converted radiation to be redirected towards a more useful direction as it hits the reflector.

In a further possible implementation form of the first aspect, the wavelength conversion unit comprises a waveguide structure configured to guide the emission radiation as it propagates within the wavelength conversion unit, allowing the wavelength conversion unit to be adapted to the form factor of the electronic device as well as surrounding components.

In a further possible implementation form of the first aspect, the wavelength conversion unit is configured such that at least one wavelength conversion unit surface extends at an angle to a main substrate plane of the substrate, the surface facing away from the substrate and the surface extending adjacent the substrate. Such a solution helps in preventing total internal reflection from occurring, since the angle can be adapted to ensure as much converted radiation as possible is propagated in the main conversion direction, out of the wavelength conversion unit.

In a further possible implementation form of the first aspect, one of the wavelength conversion unit and the substrate tapers as it extends along the main emission plane or the main substrate plane, allowing the wavelength conversion unit surface to be angled by the simplest means possible.

In a further possible implementation form of the first aspect, the pixel further comprises at least one optical functional element arranged at the wavelength conversion unit surface facing away from the substrate, the optical functional element being one of arranged on top of the wavelength conversion unit surface and integrated with the wavelength conversion unit surface.

In a further possible implementation form of the first aspect, the optical functional element is at least one of a refractive lens and a diffractive lens, e.g. enhancing the focusing of the converted radiation.

In a further possible implementation form of the first aspect, the optical functional element is a surface structure, preferably one of a surface grating, a surface roughening, a surface coating, or a micro-pillar, enhancing the outcoupling efficiency of the pixel structure.

In a further possible implementation form of the first aspect, several of the plurality of LED emitters are operably connected to one wavelength conversion unit, the LED emitters being configured to emit emission radiation both simultaneously and independently into the wavelength conversion unit. This provides a redundancy giving better yield as well as ensuring that, should one of the LED emitters fail, the pixel structure still functions as intended without any dark areas.

In a further possible implementation form of the first aspect, the pixel structure comprises

- six LED emitters, a first pair of LED emitters being operably connected to a first wavelength conversion unit, the first wavelength conversion unit being configured to convert emission radiation from the first pair of LED emitters to first converted radiation,
- a second pair of LED emitters being operably connected to a second wavelength conversion unit, the second wavelength conversion unit being configured to convert emission radiation from the second pair of LED emitters to second converted radiation, and, optionally, each LED emitter of a third pair of LED emitters is operably connected to one radiation scattering unit or one further wavelength conversion unit, the further wavelength conversion units being configured to convert emission radiation from the third pair of LED emitters to third converted radiation. This provides for a pixel structure capable of emitting radiation in three wavelengths simultaneously and with redundancy.

In a further possible implementation form of the first aspect, the pixel structure further comprises a control arrangement for adjusting a total output of converted radiation, the adjusting comprising one of pulse-width-modulation and adjustment of drive current of the LED emitter(s). The control arrangement allows, e.g., built-in redundancy to be used appropriately, e.g. steering the pairs of LED emitters such that they either provide better yield or such that the one LED emitter compensates for the other LED emitter of the pair failing.

According to a second aspect, there is provided an electronic device comprising an electronic display having a user interface surface, and at least one pixel structure according to the above. The pixel structure is configured to allow emission radiation of one emission wavelength to be emitted in multiple emission directions within a main emission plane, the main emission plane extending in parallel with the user interface surface, to convert at least a part of the emission radiation into converted radiation of a least one converted wavelength, the converted wavelength being different from the emission wavelength,

- and to direct the converted radiation in a main conversion direction perpendicular to the main emission plane and the user interface surface.

This pixel structure has a significantly reduced height, leaving free space internally within the electronic device for other components, or providing additional freedom for the form factor of the device. Furthermore, the electronic display will have an improved lifetime, due to the improved heat dissipation of the pixel structures. Also, since the fill factor of a pixel structure, in lateral directions, i.e. in directions within the main emission plane, is low form many electronic devices, this structure leaves much free space to accommodate the conversion units while still providing sufficient degrees of freedom for further components or structure improvements.

In a possible implementation form of the second aspect, the electronic device comprises a plurality of identical pixel structures, the pixel structures being distributed in the main emission plane in a two-dimensional pattern, the two-dimensional pattern comprising rows of pixel structures and columns of pixel structures, the rows extending in parallel and intersecting the columns at perpendicular angles, a number of pixel structures in an individual row being independent of a number of pixel structures in an adjacent row, and

- a number of pixel structures in an individual column being independent of a number of pixel structures in an adjacent column, the distribution of pixel structures allowing maximization of a number of pixel structures in an area comprising the two-dimensional pattern when necessary, and a simpler structure when maximization is not needed.

In a further possible implementation form of the second aspect, the plurality of pixel structures are distributed, with a first pitch, in the two-dimensional pattern such that at least a first emission direction of the emission radiation of an individual pixel structure is aligned with a corresponding first emission direction of an adjacent pixel structure, sufficient for example for a far-view display.

In a further possible implementation form of the second aspect, the plurality of pixel structures are distributed, with a second pitch, in the two-dimensional pattern such that at least a first emission direction of the emission radiation of an individual pixel structure is misaligned with a corresponding first emission direction of an adjacent pixel structure, allowing maximization of the number of pixel structures in an area comprising the two-dimensional pattern, necessary for example for a near-view display.

In a further possible implementation form of the second aspect, the pixel structures are separated by the first pitch, and the pixel structures are aligned in at least one of a direction of the columns and a direction of the rows, such that the absorption path(s) of the wavelength conversion unit(s) of an individual pixel structure is/are aligned with the corresponding absorption path(s) of an adjacent pixel structure.

In a further possible implementation form of the second aspect, the pixel structures are separated by the second pitch, and each pixel structure is rotated by an angle, in the main emission plane, such that the absorption path(s) of the wavelength conversion unit(s) of an individual pixel structure is/are misaligned with the corresponding absorption path(s) of an adjacent pixel structure, the misalignment being a lateral offset and/or an angular offset of the orientation of each pixel structure.

In a further possible implementation form of the second aspect, the pixel structures in an individual row are offset, in a direction of the columns, with respect to the pixel structures in an adjacent row, and/or the pixel structures in an individual column are offset, in a direction of the rows, with respect to the pixel structures in an adjacent column.

In a further possible implementation form of the second aspect, the length of the absorption path is fixed, the length is 10-500 μm, preferably <20 μm, and the second pitch is 20-150 μm, preferably 30-80 μm, in display applications configured such that a distance between an eye of a user and the user interface surface (2*a*) is <1 m, and the second pitch is ≥70 μm, preferably ≥100 μm, in display applications configured such that a corresponding distance between an eye of a user and the user interface surface (2*a*) is ≥0.5 m.

In a further possible implementation form of the second aspect, the converted radiation propagates in the main conversion direction, towards the user interface surface, without application of radiation filtering, reducing the number of components necessary, the space needed for the pixel structure, as well as the number of error sources.

These and other aspects will be apparent from the embodiments described below.

BRIEF DESCRIPTION OF THE DRAWINGS

In the following detailed portion of the present disclosure, the aspects, embodiments and implementations will be explained in more detail with reference to the example embodiments shown in the drawings, in which:

FIGS. 1*a* and 1*b* show side and top views of a prior art pixel structure;

FIGS. 2*a* and 2*b* show side and top views of a pixel structure in accordance with an embodiment of the present invention;

DETAILED DESCRIPTION OF ILLUSTRATIVE EMBODIMENTS

Figure 3A:
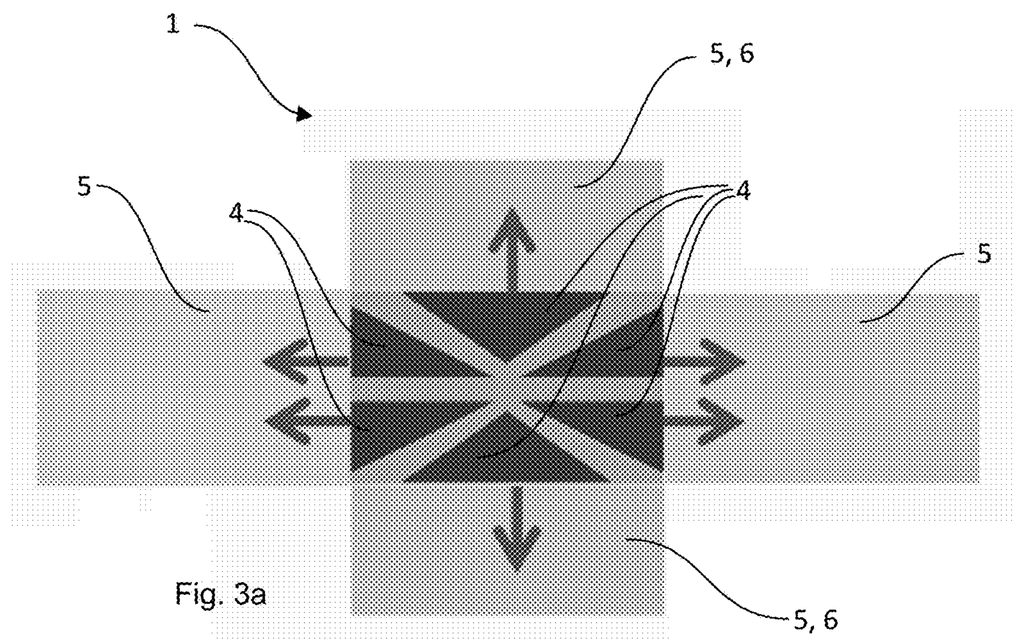
FIGS. 3*a* and 3*b* show top and side views of a pixel structure in accordance with an embodiment of the present invention.
Figure 3B:
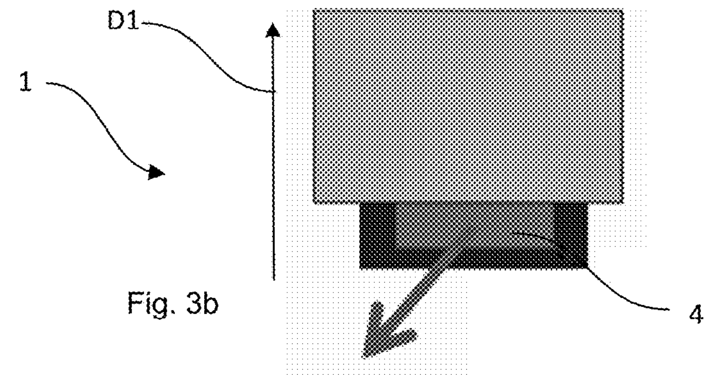

FIGS. 1*a* and 1*b* show side and top views of a color conversion pixel structure according to prior art. Several LED emitters 4 emit emission radiation R1, e.g. within the blue spectral range, in a direction D1. Conversion units 5, stacked on top of the LED emitters 4, absorb the emission radiation R1, convert it to converted radiation R2, and subsequently emit the converted radiation R2, also in direction D1.

FIGS. 2*a* and 2*b* show side and top views of one embodiment of a color conversion pixel structure according to the present invention. FIGS. 3*a* to 9 show further embodiments of color conversion pixel structures. These color conversion pixel structures are to be used in an electronic display 2, the display comprising any necessary number of identical pixel structures.

The pixel structure 1 comprises, as shown in FIG. 2*a*, a substrate 3 configured to carry at least one LED emitter 4 and at least one wavelength conversion unit 5 arranged on the substrate 3 adjacent the LED emitter 4. The LED emitter 4, the wavelength conversion unit 5, and additional components mentioned further below may be connected to the substrate 3 by means of soldering, adhesive, or nanowires. The substrate 3 may comprise one integral substrate or several aligned partial substrates, and extends at least partially within one main substrate plane P2. The substrate 3 may have a partially stepped configuration, however, each pixel structure 1 is arranged in one common plane such that its radiation emitting and radiation converting components are all aligned in a main emission plane P1. The main emission plane P1 extends in parallel with the main substrate plane P2 of the substrate 3, as shown in FIG. 2*a*, and the LED emitters 4 and the wavelength conversion units 5 are distributed in the main emission plane P1. By such a distribution, the wavelength conversion unit 5 may have a height, in in a main conversion direction D1, of some 10 to 100 μm, while the length/width of the wavelength conversion unit 5 may be over 100 μm, even above 1000 μm.

The one or several LED emitter(s) is/are 4 arranged on the substrate 3 such that each LED emitters 4 can emit emission radiation R1 within the main emission plane P1, i.e. laterally through the side of the LED emitter. The emission radiation R1, emitted by an LED emitter 4, may be emitted in a first emission direction D2 only, or in a plurality of emission directions D2, . . . , Dn covering part of, or all of, a 360° area around the LED emitter 4. The emission radiation R1 is also known as pump light.

All of the emission radiation R1 emitted by a plurality of LED emitters 4 is within one and the same emission wavelength range. The emission wavelength range may be the blue spectral range or the ultraviolet spectral range.

Each wavelength conversion unit 5 is configured to convert emission radiation R1 to converted radiation R2. The converted radiation R2 is within a converted wavelength range, which is at least partially, preferably completely, different from the emission wavelength range. Different wavelength conversion units 5 may convert the emission radiation R1 to converted radiation R2 within different converted radiation rages, R21, R22. The pixel structure 1 may comprise a plurality of wavelength conversion units 5, each wavelength conversion unit 5 being configured to convert emission radiation R1 to converted radiation R2 within one of a plurality of converted wavelength ranges.

In one embodiment, the pixel structure 1 comprises at least one first wavelength conversion unit 5 configured to convert emission radiation R1 to a first converted radiation R21 within a first converted wavelength range, e.g. the red spectral range, and at least one second wavelength conversion unit 5 configured to convert emission radiation R1 to a second converted radiation R22 within a second converted wavelength range, e.g. the green spectral range.

In a further embodiment, the pixel structure 1 comprises wavelength conversion units 5 converting emission radiation R1 to converted radiation within the red spectral range R21, to converted radiation within the green spectral range R22, and to converted radiation within the yellow spectral range R23 (not shown). The pixel structure 1 may comprise any number of wavelength conversion units 5 converting emission radiation R1 to radiation within any number of desired spectral ranges R2, R21, R22, R23, . . . , R2*n*.

The converted radiation R2 propagates, from the wavelength conversion unit 5, in a main conversion direction D1 extending substantially perpendicular to the main emission plane P1, i.e. through the top surface of the wavelength conversion unit 5. The converted radiation R2, in other words, propagates in a direction away from the substrate 3 towards, e.g. a user interface surface 2a of an electronic device 13 comprised within the electronic display 2.

Figure 4:
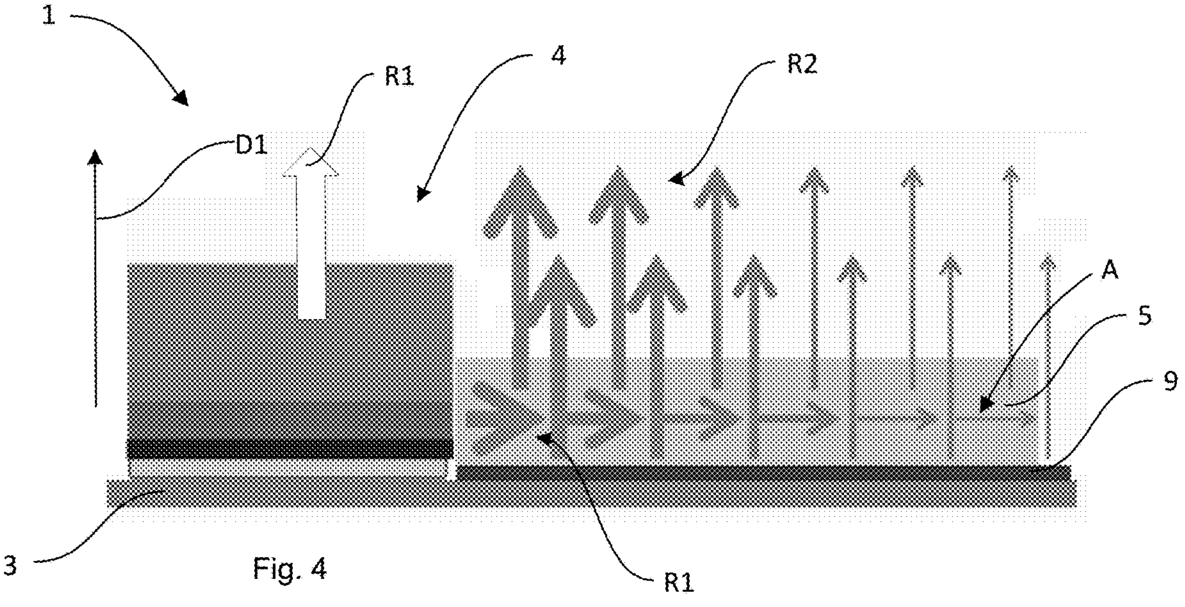
FIGS. 4 to 9 shows partial cross-sections of pixel structures in accordance with different embodiments of the present invention.

In one embodiment, shown in FIG. 4, at least one of the LED emitters 4 is configured to emit emission radiation R1 directly in the main conversion direction D1, i.e. the emitted emission radiation R1 maintains its direction and wavelength as it propagates in the main conversion direction D1.

Figures 5, 6, 7:
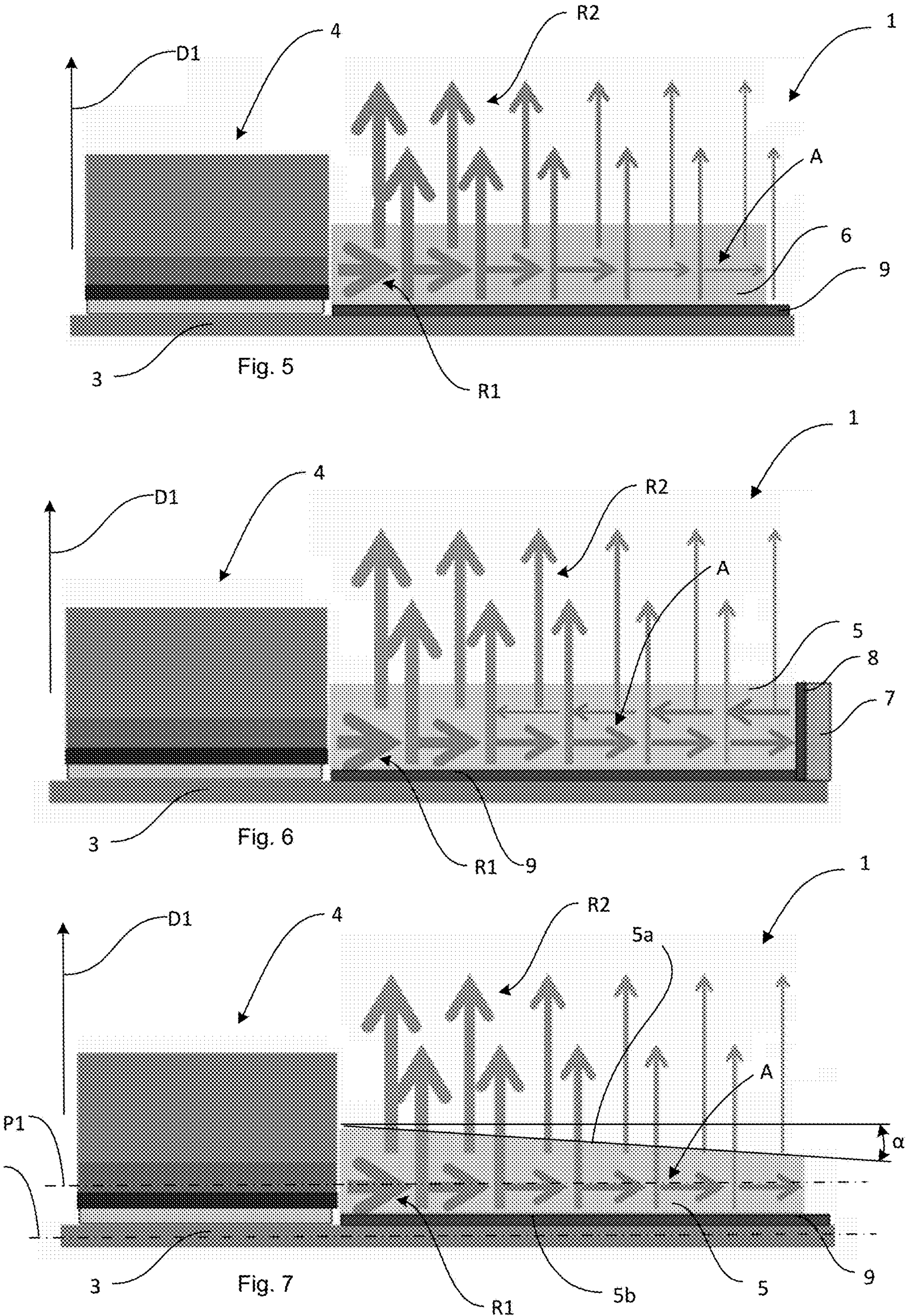

In further embodiments, shown in FIGS. 5 to 7, the LED emitter(s) 4 is/are configured to only emit emission radiation R1 in the main emission plane (P1), i.e. not directly in the main conversion direction D1 but laterally through at least one side or through all sides of the LED emitter 4 into the wavelength conversion unit 5 or into multiple conversion units 5. The wavelength conversion units 5 can be arranged to only convert the emission radiation R1, or portions of the emission radiation R1, which is/are emitted from one side, or from all sides, of the LED emitter 4 to converted radiation R2.

In a further embodiment, the pixel structure 1 comprises at least one radiation scattering unit 6, as shown In FIG. 5. The radiation scattering unit 6 is arranged on the substrate 3 adjacent the LED emitter 4, similar to the arrangement of the wavelength conversion units 5. The scattering unit 6 is configured to redirect emission radiation R1, propagating in the main emission plane P1, to the main conversion direction D1, without conversion, i.e. without changing the wavelength of the emission radiation R1. The scattering unit 6 may comprise a polymer matrix material such as polymethyl methacrylate (PMMA) with scattering particles distributed within the matrix material. The scattering particles scatter the incoming emission radiation R1 in all directions, and preferably, radiation R1 directed towards the bottom of the scattering unit 6, i.e. the substrate 3, is easily redirected towards the top of the scattering unit 6 by means of, e.g. a reflector such as the bottom reflector 9 described further below. The scattering unit 6 may have a height, in in a main conversion direction D1, of some 10 to 100 μm, while the length/width of the scattering unit 6 may be over 100 μm, even above 1000 μm. Generally, the amount of scattering particles is large enough to allow the scattering unit 6 to have a relatively low height.

Each wavelength conversion unit 5 comprises a wavelength conversion material. The wavelength conversion material may be a matrix material comprising wavelength conversion particles distributed within the matrix material. The wavelength conversion particles may be quantum dots or phosphorus material.

As shown in FIG. 6, the wavelength conversion unit 5 may comprise at least one barrier 7 extending along a periphery of the wavelength conversion unit 5 in the main conversion direction D1. The barrier 7 may extend along at least one long edge of the wavelength conversion unit 5 (not shown), along one short end of the wavelength conversion unit 5, as shown in FIG. 6, or around the long edges and the short end of the wavelength conversion unit 5 such that the walls of wavelength conversion unit 5 are covered by the barrier 7 in the main conversion direction D1, as indicated in at least FIGS. 11 and 15. The barrier 7 may be integrated between adjacent pixel structures 1 by nano imprint technology with a polymer layer or by photolithography of a photosensitive polymer material such as benzocyclobutene (BCB).

The barrier 7 is configured to extend an absorption path A of the wavelength conversion unit 5. The absorption path A extends in the main emission plane P1 within the wavelength conversion unit 5. As the emission radiation R1 propagates in the wavelength conversion unit 5, it propagates as well as is absorbed along the absorption path A. The absorption, and hence the conversion of emission radiation R1 to converted radiation R2, occurs simultaneously with the propagation, as indicated in FIGS. 4 to 9. As the emission radiation R1 propagates along the absorption path A, the intensity of the emission radiation R1 decreases, usually exponentially.

The barrier 7 reduces the optical cross-talk occurring between adjacent pixel structures 1, and allows the absorption path A of a wavelength conversion unit 5 to be extended by means of at least one wall reflector 8.

Figures 11, 12, 13, 14:
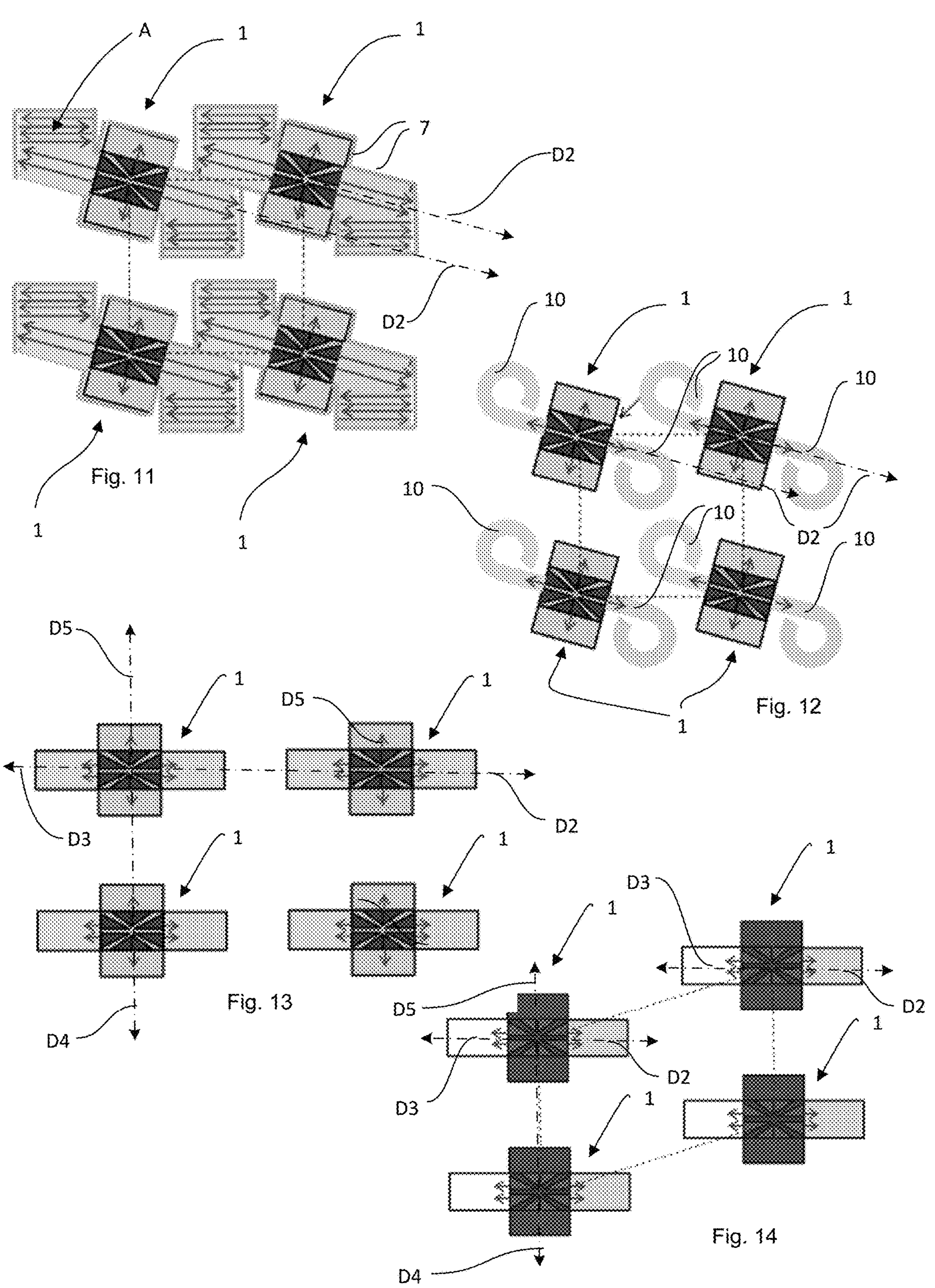
FIGS. 11 to 18 show schematic top views of the distribution of pixel structures for an electronic display.

In one embodiment, shown in FIG. 6, at least one wall reflector 8 is arranged on the barrier 7, preferably on a surface of the barrier 7 extending at least partially in the main conversion direction D1. The wall reflector 8 is configured to redirect the emission radiation which propagates along the absorption path A, such that the absorption path A of the wavelength conversion unit 5 is extended within the main emission plane P1. Such folding of the absorption path A, which may be up to 180° from the original emission direction D2, . . . , Dn, is shown in FIG. 11.

As shown in FIGS. 4 to 9, at least one bottom reflector 9 may be arranged between the wavelength conversion unit 5 and the substrate 3, preferably on top of the surface of the substrate 3 on which the LED emitters 4 and the wavelength conversion unit 5 are distributed. The bottom reflector 9 extends at least partially in parallel with the main emission plane P1 and is configured to redirect converted radiation R2, which propagates within the wavelength conversion unit 4 in substantially all directions, towards the main conversion direction D1. For example, converted radiation R2 directed towards the bottom of the wavelength conversion unit 5, i.e. the substrate 3, is easily redirected towards the top of the wavelength conversion unit 5.

The wall reflector 8 and/or the bottom reflector 9 may extend at an angle to the main conversion direction D1. The wall reflector 8 may extend at an angle which is not perpendicular to the main emission plane P1, such that emission radiation R1 hitting the wall reflector 8 is directed towards the substrate 3, and preferably the bottom reflector 9, or towards a user interface surface 2. The bottom reflector 9 may extend parallel with the main emission plane P1, in order to reflect emission radiation R1 propagating towards the substrate 3, or it may extend at an angle to the main emission plane P1, such that the reflection of emission radiation R1 propagating towards the substrate 3 can be steered in a specific, predetermined direction. The wall reflector 8 and/or the bottom reflector 9 may comprises a reflective surface, preferably a metal layer. The metal layer may be a sputtered aluminum layer, in which case the wall reflector 8 and/or the bottom reflector 9 also prevents optical cross-talk between adjacent pixel structures.

Correspondingly, the wavelength conversion unit 5 may be configured such that at least one wavelength conversion unit surface 5a, 5b extends at an angle α to a main substrate plane P2 of the substrate 3, the surface 5a facing away from the substrate 3 and the surface 5b extending adjacent the substrate 3. At least one of the wavelength conversion unit surface 5a, 5b extends at an angle α due to, the wavelength conversion unit 5, the substrate 3, or both being wedge shaped, i.e. tapering as it extends along the main emission plane P1 or the main substrate plane P2. FIG. 7 shows an embodiment wherein only wavelength conversion unit surface 5a extends at an angle α to the main substrate plane P2 of the substrate 3, due to the wavelength conversion unit 5 itself tapering. Both wavelength conversion unit surfaces 5a,

5*b* may extends at an angle α to the main substrate plane P2 of the substrate 3. Furthermore, wavelength conversion unit surface 5*a* may extend at an angle α1, and wavelength conversion unit surface 5*b* may extend at an angle α2. Due to the higher refractive index of the wavelength conversion unit matrix material, compared to surrounding air, only converted radiation R2 hitting the wavelength conversion unit surface 5*a*, 5*b* at an angle smaller than the critical angle for total internal reflection will leave the wavelength conversion unit 5, while the other converted radiation R2 will be reflected at the wavelength conversion unit surface 5*a*, 5*b* and remain within the wavelength conversion unit 5. By applying the above-mentioned tapering wedge shape, radiation output efficiency is enhanced since radiation captured inside the wavelength conversion unit 5 will eventually hit the wavelength conversion unit surface 5*a*, 5*b* at a smaller angle as it is being reflected.

As shown in FIG. 12, the wavelength conversion unit 5 may comprise a waveguide structure 10 configured to guide the emission radiation R1 as it propagates within the wavelength conversion unit 5. The waveguide structure may have any suitable shape, e.g. curved as in FIG. 12 or spiral shaped (not shown).

Figures 8, 9, 10:
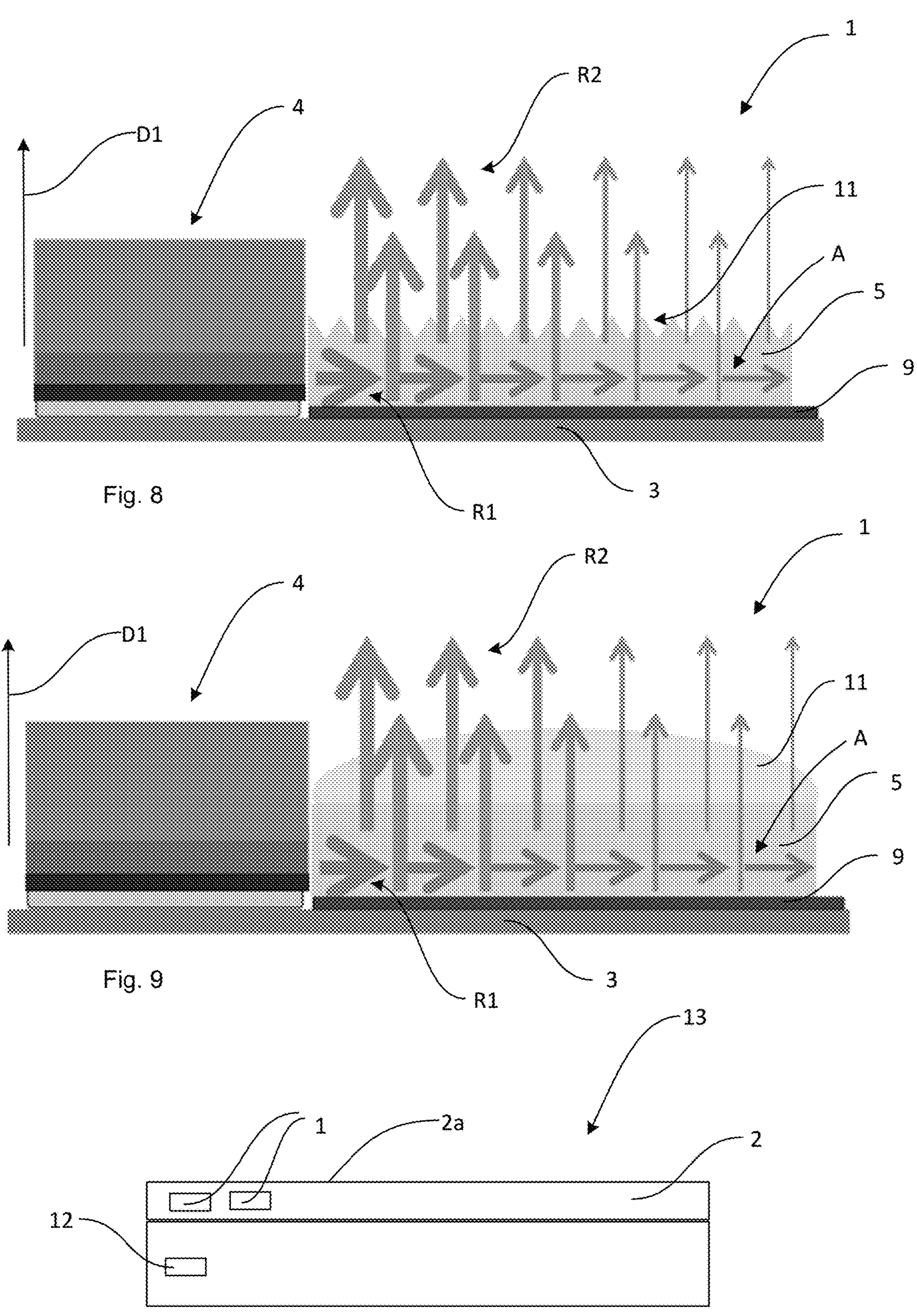
FIG. 10 shows a schematic side view of an electronic device comprising pixel structures in accordance with embodiments of the present invention.

The pixel structure 1 may further comprise at least one optical functional element 11 arranged at the wavelength conversion unit surface 5*a* facing away from the substrate 3, as shown in FIGS. 8 and 9. The optical functional element 11 may be arranged on top of the wavelength conversion unit surface 5*a*, as shown in FIG. 9, or integrated with the wavelength conversion unit surface 5*a*, as shown in FIG. 8.

The optical functional element 11, shown in FIG. 9, may be at least one of a refractive lens and a diffractive lens, used to e.g. focus the converted radiation R2.

The optical functional element 11 instead may be a surface structure, preferably one of a surface grating, as shown in FIG. 8, a surface roughening, a surface coating, or a micro-pillar. The grating enhances the outcoupling efficiency of the converted radiation R2, by steering the converted radiation R2.

As shown in FIG. 2*b*, several of the LED emitters 4 may be operably connected to one wavelength conversion unit 5, and configured to emit emission radiation R1 both simultaneously and independently into the wavelength conversion unit 5. This provides a redundancy giving better yield as well as ensuring that, should one of the LED emitters 4 fail, the pixel structure 1 still functions as intended without any dark areas.

As indicated in FIG. 10, a control arrangement 12 is provided for adjusting a total output of converted radiation R2, R21, R22, the adjusting comprising one of pulse-width-modulation and adjustment of drive current of the LED emitters 4.

In one embodiment, the converted radiation R2, R21, R22 propagates in the main conversion direction D2, towards the user interface surface 2*a*, without application of radiation filtering.

The pixel structure 1 may comprise at least three LED emitters 4, wherein at least one first wavelength conversion unit 5 is operably connected to a first LED emitter 4, and at least one second wavelength conversion unit 5 is operably connected to a second LED emitter 4. As shown in FIG. 2*b*, the pixel structure 1 may comprise six LED emitters 4, a first pair of LED emitters 4 being operably connected to a first wavelength conversion unit 5, and a second pair of LED emitters 4 being operably connected to a second wavelength conversion unit 5. The first wavelength conversion unit 5 is preferably configured to convert emission radiation R1 from the first pair of LED emitters 4 to first converted radiation R2, and the second wavelength conversion unit 5 is preferably configured to convert emission radiation R1 from the second pair of LED emitters 4 to second converted radiation R2.

As also shown in FIG. 2*b*, each LED emitter 4 of a third pair of LED emitters 4 may be operably connected to one radiation scattering unit 6 or one further wavelength conversion unit 5 each. When the emission radiation R1 is within the ultraviolet spectral range, the third pair of LED emitters 4 are preferably operably connected to one further wavelength conversion unit 5 each, the further wavelength conversion units 5 being configured to convert emission radiation R1, within the ultraviolet spectral range, from the third pair of LED emitters 4 to third converted radiation R3, e.g. within the blue spectral range (not shown). When, instead, the emission radiation R1 is within the blue spectral range, the third pair of LED emitters 4 are preferably operably connected to one radiation scattering unit 5 each. Each LED emitter 4 may be operably connected to one wavelength conversion unit 5, optionally the connection comprises a contact layer anode for each LED emitter, e.g. a metal contact layer shown as the bottom layer in FIG. 3*b*, and the substrate 3 comprises a cathode layer. The metal contact layer supplies current to the LED emitter and prevents undesired emission radiation R1 towards the bottom of the LED emitter, and hence the substrate 3.

FIG. 10 illustrates an electronic device 13 comprising an electronic display 2 having a user interface surface 2*a*, and at least one pixel structure 1. The pixel structure 1 is configured to allow emission radiation R1 of one emission wavelength to be emitted in multiple emission directions D2, . . . , Dn within a main emission plane P1, as indicated in FIG. 2*b*, to convert at least a part of the emission radiation R1 into converted radiation R2, R21, R22 of a least one converted wavelength, and to direct the converted radiation R2, R21, R22 in a main conversion direction D1 perpendicular to the main emission plane P1 and the user interface surface 2*a*. The main emission plane P1 extends substantially in parallel with the user interface surface 2*a*. The pixel structure 1 is configured to convert emission radiation into at least one, preferably several, converted wavelengths, the different converted wavelengths being different from each other and from the emission wavelength.

Figure 17:
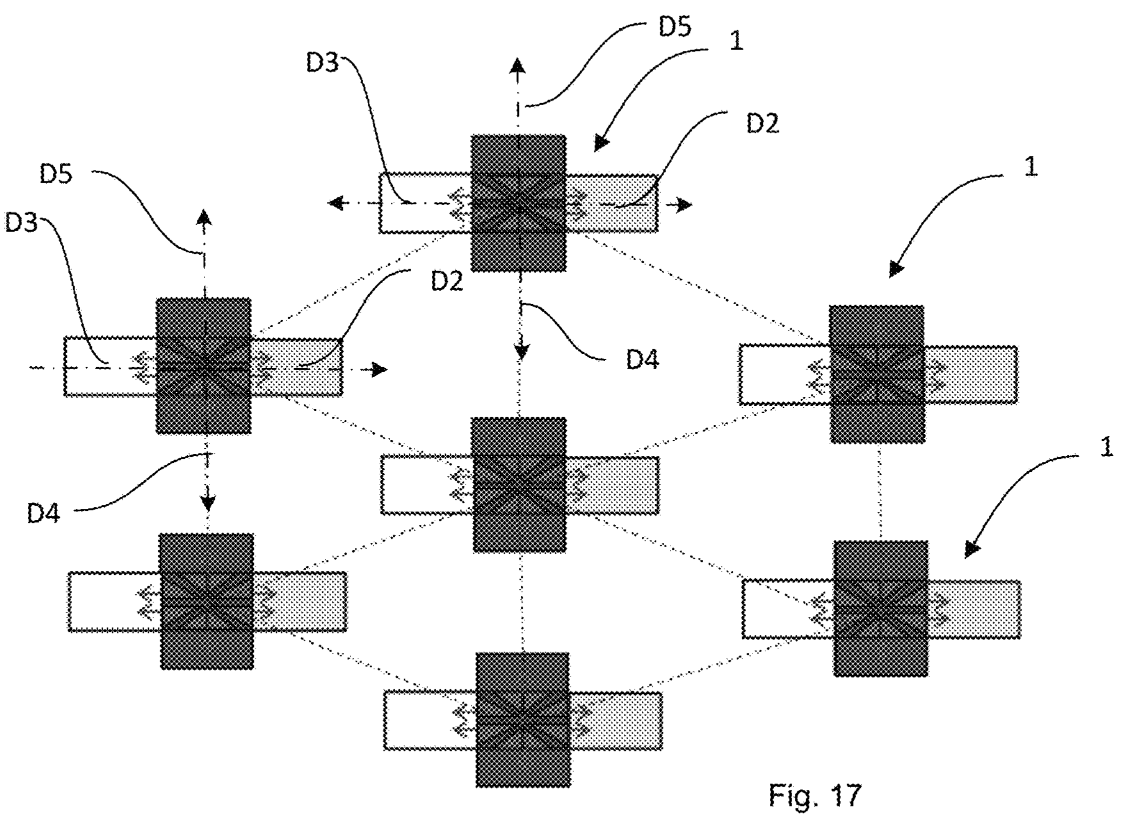

As shown in FIGS. 11 to 18, the electronic device 13 may comprise a plurality of identical pixel structures 1, the pixel structures 1 being distributed in the main emission plane P1 in a two-dimensional pattern. The two-dimensional pattern comprises rows of pixel structures 1 and columns of pixel structures 1, the rows extending in parallel and intersecting the columns at perpendicular angles. The number of pixel structures 1 in an individual row is independent of the number of pixel structures 1 in an adjacent row, as indicated in FIG. 17 which shows, alternately, one and two pixel structures 1 in each row and in FIG. 18 which shows, alternately, two and three pixel structures 1 in each row. Correspondingly, the number of pixel structures 1 in an individual column is independent of the number of pixel structures 1 in an adjacent column, as indicated in FIG. 17 which shows, alternately, two and three pixel structures 1 in each column and in FIG. 18 which shows, alternately, one and two pixel structures 1 in each column. This distribution of pixel structures 1 allow maximization of the number of pixel structures 1 in the area comprising the two-dimensional pattern.

As shown in FIG. 13, the plurality of pixel structures 1 may be distributed, with a first pitch, in the two-dimensional pattern such that at least a first emission direction D2 of the emission radiation R1 in of an individual pixel structure 1 is aligned with a corresponding first emission direction D2 of an adjacent pixel structure 1. As also shown in FIG. 13, second, third and fourth emission directions D3, D4, and D5 may also be aligned with a corresponding second, third and fourth emission directions D3, D4, and D5 of an adjacent pixel structure 1. In other words, the pixel structures 1 may be arranged in a two-dimensional, rectangular grid pattern wherein the number of pixel structures 1 in a row, the number of pixel structures 1 in a column, the distances between rows, and the distances between columns are constant. The pitch is the distance between center points of adjacent pixel structures 1. This type of aligned arrangement is suitable when the absorption path A length is small compared to the pitch.

As shown in FIGS. 11, 12, and 14 to 18, the plurality of pixel structures 1 may instead be distributed, with a second pitch, in the two-dimensional pattern such that at least a first emission direction D2 of the emission radiation R1 of an individual pixel structure 1 is misaligned with a corresponding first emission direction D2 of an adjacent pixel structure 1. Preferably, misaligned emission directions extend in parallel, such that all pixel structures 1 are misaligned by the same amount and in the same direction, e.g. by being rotated in the main emission plane P1 with regards to the column and row pattern.

Figures 15, 16:
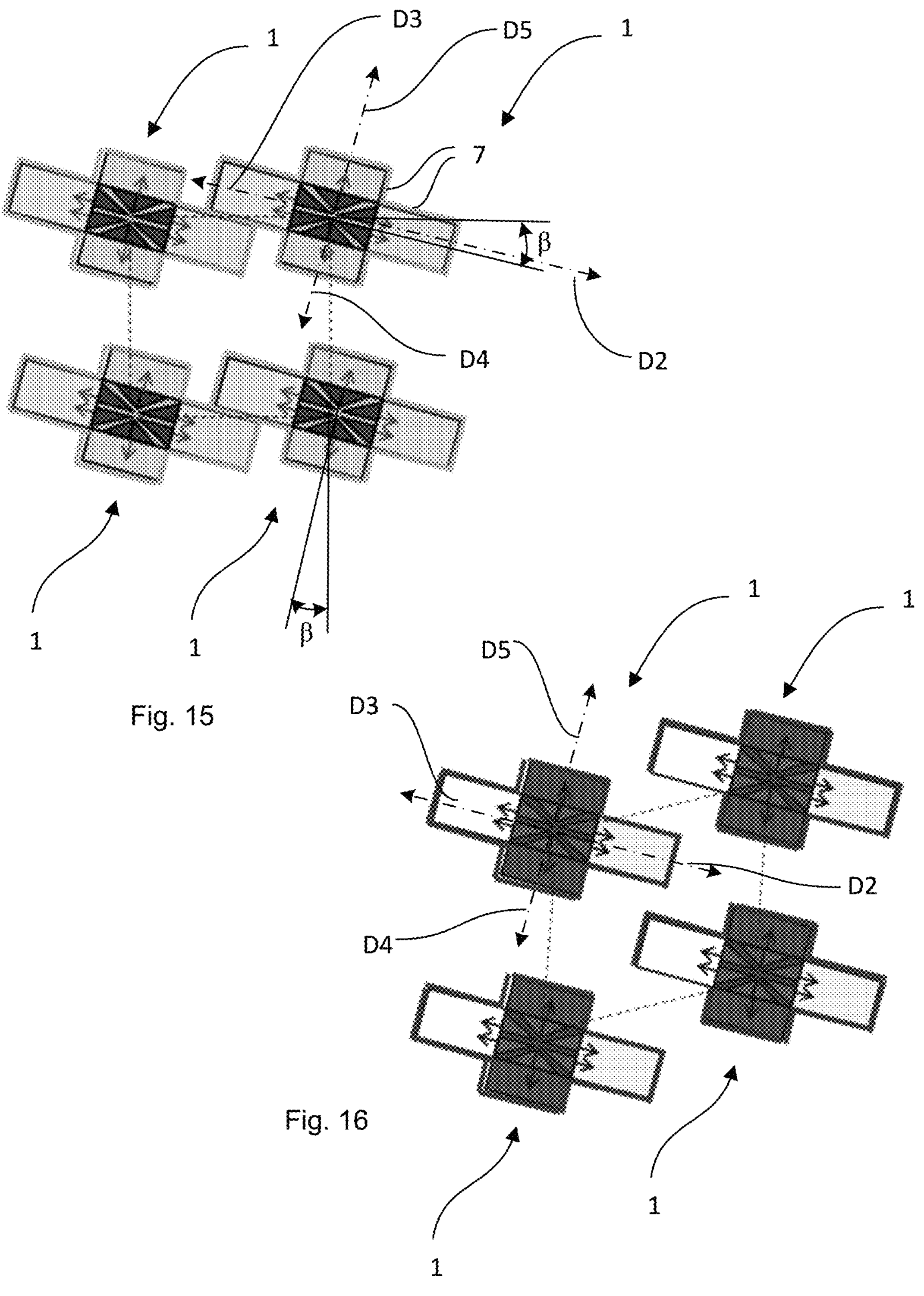

Regardless of possible rotation, the pixel structures 1 may be arranged such that their center points are aligned in both directions of the two-dimensional pattern, as show in FIGS. 11, 12, and 15. The pixel structures 1 may also be arranged such that their center points are aligned in one directions of the two-dimensional pattern, while being offset in the other direction, as show in FIGS. 14 and 16. As show in FIGS. 17 and 18, the pixel structures 1 may also be arranged such that their center points are misaligned in both directions of the two-dimensional pattern. Rotated, misaligned arrangement is suitable when the absorption path A length is large compared to the pitch.

The misalignment allows an extension of the length of the absorption path A of each such pixel structure 1 having one or several misaligned emission directions. Since the emission directions are misaligned, and do not extend along the same rows or columns but instead within vacant areas between such rows and columns, the length of each absorption path A is less restricted by the length of adjacent absorption paths A. Hence, the dimension of the absorption path A may exceed e.g. the outer dimension of the wavelength conversion unit 5 in the main emission plane P1, i.e. the length of the absorption path A may be longer than the length, or rather width, of the wavelength conversion unit 5 that it extends within. For example, FIG. 11 shows an embodiment wherein the absorption path A has been folded twice, at opposite ends of the wavelength conversion unit 5, and FIG. 12 shows an embodiment wherein the absorption path A has been curved.

FIGS. 14 to 18 show embodiments wherein the pitch between adjacent pixel structures 1 has been reduced. In FIG. 15 the pitch is similar to the length of the absorption path A so that it cannot fit two adjacent absorption paths on a straight line between pixels. Therefore the emission direction of each pixel structure 1 is rotated in respect to the pattern of pixel structures 1 in a way that the absorption path A of one pixel structure 1 is next to the absorption path A of the adjacent pixel structure 1 without overlapping. Thereby the pitch between pixel structures 1 is utilized to the maximum extent for the absorption path A. The absorption path A should be sufficiently long to ensure high color conversion efficiency and high absorption of the emission radiation R1, in particular in the blue spectral range.

FIG. 14 shows an embodiment wherein the first emission direction D2 and the second emission direction D3 of an individual pixel structure 1 are misaligned to exhibit a lateral offset with a corresponding first emission direction D2 and second emission direction D3 of an adjacent pixel structure, while the third and fourth emission directions D4, D5 are aligned, because the required absorption path length is shorter for the emission from D4 and D5.

FIGS. 15 and 16 show embodiments wherein the first emission direction D2, the second emission direction D3, the third emission direction D4, and the fourth emission direction D5 of an individual pixel structure 1 are all misaligned with corresponding emission directions D2, D3, D4, D5 of an adjacent pixel structure, such that the two-dimensional pattern comprises one or several interconnected parallelograms.

Figure 18:
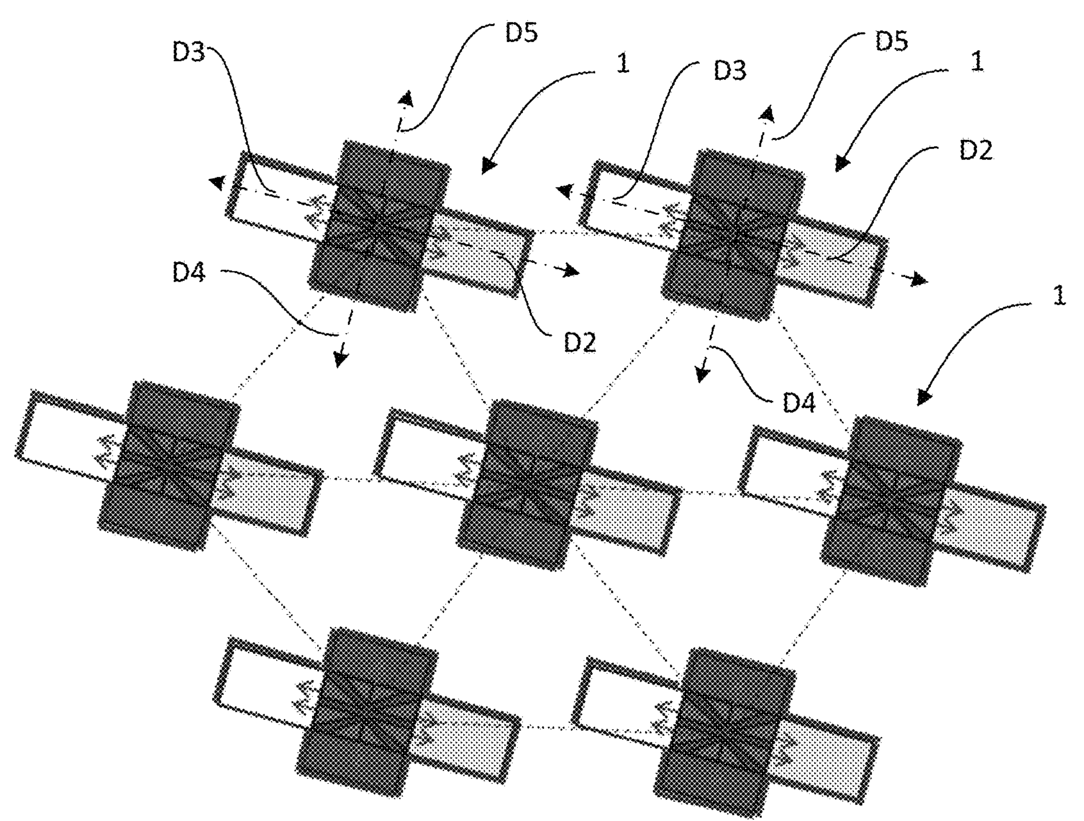

FIGS. 17 and 18 show embodiments wherein the first emission direction D2, the second emission direction D3, the third emission direction D4, and the fourth emission direction D5 of an individual pixel structure 1 are all misaligned to exhibit a lateral offset with corresponding emission directions D2, D3, D4, D5 of an adjacent pixel structure, and such that the two-dimensional pattern comprises a honeycomb pattern of distributed pixel structures 1.

As mentioned above, the pixel structures 1 may be arranged at, i.e. separated by, a first pitch. In this case, the pixel structures 1 are aligned in at least one of a direction of the columns and a direction of the rows, such that the absorption path(s) A of the wavelength conversion unit(s) 5 of an individual pixel structure 1 is/are aligned with the corresponding absorption path(s) A of an adjacent pixel structure.

As mentioned above, the pixel structures 1 may be arranged in a two dimensional array. Each pixel structure 1 may occupy an area of identical size and/or have the same length absorption path(s) A as the other pixel structures 1. The absorption length may be 10-500 μm, preferably <20 μm. The pitch of the pixel structures 1 in the two dimensional array may be 20-150 μm, preferably 30-80 μm, in display applications configured such that a distance between an eye of a user and the user interface surface 2*a* is <1 m, i.e. for near view displays such as those on smartphones. Correspondingly, the second pitch may be ≥70 μm, preferably ≥100 μm, in display applications configured such that a corresponding distance between an eye of a user and the user interface surface 2*a* is ≥0.5 m, i.e. for far view displays such as those on TVs.

The plurality of pixel structures 1 distributed with a second pitch may be rotated by an angle β, in the main emission plane P1, as shown in FIGS. 11, 12, 15, 16, and 18, such that the absorption paths A of the wavelength conversion units 5 of an individual pixel structure 1 is/are misaligned with the corresponding absorption paths A of an adjacent pixel structure.

Furthermore, the pixel structures 1 in an individual row may be offset, in a direction of the columns, with respect to the pixel structures 1 in an adjacent row, as shown in FIGS. 14, 16 and 17. Correspondingly, the pixel structures 1 in an individual column may be offset, in a direction of the rows, with respect to the pixel structures 1 in an adjacent column, as shown in FIG. 18.

The various aspects and implementations have been described in conjunction with various embodiments herein. However, other variations to the disclosed embodiments can be understood and effected by those skilled in the art in practicing the claimed subject-matter, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems.

The reference signs used in the claims shall not be construed as limiting the scope. Unless otherwise indicated, the drawings are intended to be read (e.g., cross-hatching, arrangement of parts, proportion, degree, etc.) together with the specification, and are to be considered a portion of the entire written description of this disclosure. As used in the description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

The invention claimed is:

1. A pixel structure, comprising:

a substrate;

at least one LED emitter arranged on the substrate, each LED emitter of the at least one LED emitter being configured to emit emission radiation that is emitted within an emission wavelength range and emitted in one or multiple emission directions within a main emission plane;

at least one wavelength converter arranged on the substrate adjacent to the at least one LED emitter, each wavelength converter being configured to convert the emission radiation from an adjacent LED emitter of the at least one LED emitter to converted radiation, the converted radiation being within a converted wavelength range and propagating from the at least one wavelength converter in a main conversion direction that is perpendicular to the main emission plane, and the converted wavelength range being different from the emission wavelength range, and wherein a height of the at least one wavelength converter over the substrate is less than a height of the at least one LED emitter over the substrate; and at least one radiation scattering device arranged on the substrate adjacent to the at least one LED emitter, wherein the at least one radiation scattering device is configured to redirect emission radiation, propagating in the main emission plane, to the main conversion direction.

2. The pixel structure according to claim 1, wherein the emission wavelength range is a blue spectral range or an ultraviolet spectral range; and wherein, when the at least one LED emitter comprises at least two LED emitters, the at least two LED emitters are configured to emit radiation having the same wavelength.

3. The pixel structure according to claim 1, wherein the at least one wavelength converter comprises at least two wavelength converters, each wavelength converter being configured to convert the emission radiation within the emission wavelength range to the converted radiation within one of a plurality of different converted wavelength ranges.

4. The pixel structure according to claim 3, wherein at least one first wavelength converter of the at least two wavelength converters is configured to convert the emission radiation from the adjacent LED emitter of the at least one LED emitter to a first converted radiation being within a first converted wavelength range; and at least one second wavelength converter of the at least two wavelength converters is configured to convert the emission radiation from the adjacent LED emitter of the at least one LED emitter to a second converted radiation being within a second converted wavelength range, the second converted wavelength range being at least partially different from the first converted wavelength range.

5. The pixel structure according to claim 4, wherein the first converted wavelength range is within a red spectral range and the second converted wavelength range is within a green spectral range.

6. The pixel structure according to claim 1, wherein:

the at least one LED emitter is configured to only emit emission radiation in the main emission plane.

7. The pixel structure according to claim 1, wherein when the at least one LED emitter comprises at least two LED emitters, at least one LED emitter of the at least two LED emitters is configured to emit emission radiation in the main conversion direction.

8. The pixel structure according to claim 1, wherein each wavelength converter of the at least one wavelength converter comprises a wavelength conversion material, and the wavelength conversion material comprises a matrix material and wavelength conversion particles distributed within the matrix material.

9. The pixel structure according to claim 8, wherein the wavelength conversion particles are quantum dots or phosphorus material.

10. The pixel structure according to claim 1, wherein each wavelength converter of the at least one wavelength converter comprises at least one barrier extending along a periphery of the respective wavelength converter in the main conversion direction, wherein each of the at least one barrier is configured to extend an absorption path of the respective wavelength converter, each absorption path extending in the main emission plane, and emission radiation propagating along each absorption path, and wherein the conversion of the emission radiation to the converted radiation occurs simultaneously with the propagation.

11. The pixel structure according to claim 10, further comprising:

at least one wall reflector arranged on a surface of the at least one barrier extending at least partially in the main conversion direction, the at least one wall reflector being configured to redirect emission radiation propagating along the corresponding absorption path in a manner that the corresponding absorption path of the respective wavelength converter is extended within the main emission plane.

12. The pixel structure according to claim 1, further comprising:

at least one bottom reflector arranged between the at least one wavelength converter and the substrate, the at least one bottom reflector extending at least partially in parallel with the main emission plane and being configured to redirect converted radiation propagating within the at least one wavelength converter to the main conversion direction.

13. The pixel structure according to claim 12, wherein the at least one wavelength converter comprises a waveguide structure configured to guide the emission radiation as it propagates within the at least one wavelength converter.

14. The pixel structure according to claim 1, wherein the at least one wavelength converter is configured in a manner that a surface of the at least one wavelength converter extends at an angle to a main substrate plane of the substrate, the surface facing away from the substrate and the surface extending adjacent to the substrate.

15. An electronic device, comprising:

an electronic display having a user interface surface; and at least one pixel structure, comprising:

a substrate;

at least one LED emitter arranged on the substrate, each LED emitter of the at least one LED emitter being configured to emit emission radiation that is emitted within an emission wavelength range and emitted in multiple emission directions within a main emission plane; and at least one wavelength converter arranged on the substrate adjacent to the at least one LED emitter, each wavelength converter of the at least one wavelength converter being configured to convert the emission radiation from an adjacent LED emitter of the at least one LED emitter to converted radiation, the converted radiation being within a converted wavelength range and propagating from the at least one wavelength converter in a main conversion direction that is perpendicular to the main emission plane, and the converted wavelength range being different from the emission wavelength range, and wherein a height of the at least one wavelength converter over the substrate is less than a height of the at least one LED emitter over the substrate;

wherein the main emission plane extends in parallel with the user interface surface; and wherein the main conversion direction is perpendicular to the user interface surface; and wherein the at least one pixel structure comprises a plurality of identical pixel structures, the plurality of identical pixel structures being distributed in the main emission plane in a two-dimensional pattern;

wherein the two-dimensional pattern comprises rows of pixel structures and columns of pixel structures, the rows of pixel structures extending in parallel and intersecting the columns of pixel structures at perpendicular angles;

wherein in the plurality of identical pixel structures a number of pixel structures in an individual row is independent of a number of pixel structures in an adjacent row, and a number of pixel structures in an individual column is independent of a number of pixel structures in an adjacent column; and wherein a distribution of pixel structures in the two-dimensional pattern allows maximization of a number of pixel structures in an area comprising the two-dimensional pattern.

16. The electronic device according to claim 15, wherein the plurality of identical pixel structures are distributed, with a first pitch, in the two-dimensional pattern such that at least a first emission direction of the emission radiation of an individual pixel structure is aligned with a corresponding first emission direction of an adjacent pixel structure.

17. The electronic device according to claim 16, wherein, when a length of an absorption path is fixed, the length is in a range of 10-500 μm; and wherein a second pitch is in a range of 20-150 μm in display applications configured such that a distance between an eye of a user and the user interface surface is <1 m; and wherein the second pitch is ≥70 μm in display applications configured such that a corresponding distance between an eye of a user and the user interface surface is ≥0.5 m.

18. The electronic device according to claim 15, wherein the plurality of identical pixel structures are distributed, with a second pitch, in the two-dimensional pattern such that at least a first emission direction of the emission radiation of an individual pixel structure is misaligned with a corresponding first emission direction of an adjacent pixel structure, the misalignment being a lateral offset or an angular offset of the orientation of each pixel structure.

19. The pixel structure according to claim 1, wherein:

a first portion of the emission radiation, which is emitted in the main emission plane by the at least one LED emitter, is converted to converted radiation in the at least one wavelength converter.

20. The electronic device according to claim 15, wherein each wavelength converter of the at least one wavelength converter comprises a wavelength conversion material, and the wavelength conversion material comprises a matrix material and wavelength conversion particles distributed within the matrix material.

* * * * *